United States Patent [19]

St. Louis

[11] 4,406,054

[45] Sep. 27, 1983

[54] METHOD OF MOUNTING AND PACKAGING ELONGATE SILICON DEVICES ON A CERAMIC BASE

[75] Inventor: Jacques R. St. Louis, Ottawa, Canada

[73] Assignee: Northern Telecom Limited, Montreal, Canada

[21] Appl. No.: 325,373

[22] Filed: Nov. 27, 1981

Related U.S. Application Data

[62] Division of Ser. No. 123,997, Feb. 25, 1980, abandoned.

[30] Foreign Application Priority Data

Jan. 9, 1980 [CA] Canada .................................. 343318

[51] Int. Cl.³ ............................................. H01L 21/58
[52] U.S. Cl. .................................... 29/588; 29/576 S; 29/589; 174/52 FP; 357/80
[58] Field of Search ...................... 29/576 S, 588, 589, 29/590, 591, 829, 830, 831; 174/52 FP; 357/65, 74, 80, 81

[56] References Cited

U.S. PATENT DOCUMENTS 3,984,620 10/1976 Robillard et al. .............. 174/52 FP

OTHER PUBLICATIONS

Hnatek, E. R., *User's Handbook of Integrated Circuits,* John Wiley and Sons, New York, 1973, pp. 360–371, 407–420.

Primary Examiner—Brian E. Hearn
Assistant Examiner—Alan E. Schiavelli
Attorney, Agent, or Firm—Sidney T. Jelly

[57] ABSTRACT

Mounting silicon devices on a ceramic substrate creates considerable problems when the device has a geometry, such as being very long relative to its width, due to flatness and thermal mismatches. In the present invention a thin silicon substrate is interposed between base and device, the substrate of a geometry which reduces flatness and thermal mismatching to acceptable levels. Also the use of a silicon substrate enables well developed and easily provided silicon technology to form conductor patterns for interconnecting between device and base, avoiding problems of producing such conductor patterns on the ceramic base. The invention is particularly useful for the mounting of linear devices, such as linear imagers, which can have a length to width ratio in excess of 20:1.

3 Claims, 9 Drawing Figures

METHOD OF MOUNTING AND PACKAGING ELONGATE SILICON DEVICES ON A CERAMIC BASE

This application is a division of Ser. No. 123,997, filed Feb. 25, 1980, now abandoned.

This invention relates to the mounting and packaging of silicon devices on ceramic substrates and to assemblies including such devices and is particularly concerned with silicon devices having fragile geometry, such as for example, a large length to width aspect ratio.

Silicon devices, such as chips or dies, particularly in the form of large scale integrated (LSI) circuit members or devices, are regularly mounted on ceramic substrates. While the flatness limits for ceramic are much higher than for silicon wafers, the size of silicon devices are usually relatively small and the geometry reasonable, that is the length to width ratio is normally not much above unity. Thus the mismatch between the flatness of ceramic substrate and silicon wafer is not such as to cause too many problems.

However, when the geometry starts to become non-conventional, such as having large length to width ratios, the device becomes very fragile. The problems can be increases still further if the bonding pads, via which electrical connections are made to the device, are concentrated at one or more positions on the device.

The present invention is concerned with the mounting of silicon devices, particularly those with extreme geometry problems, on ceramic substrates. Particularly the invention provides for the mounting of a silicon device, having geometrically or otherwise fragility problems, on a silicon substrate having a more acceptable geometrical form, the silicon substrate in turn being mounted on a ceramic substrate. The invention also provides a silicon device assembly comprising a silicon device mounted on a silicon substrate, the substrate in turn mounted on a ceramic substrate.

There is provided good, to all intents and purposes, identical, thermal match between silicon devices and silicon substrates; the ability to use high resolution processing typical of silicon technology; and excellent flatness characteristics between device and substrate.

The invention will be readily appreciated from the following description of a particular embodiment, by way of example only, in conjunction with the accompanying drawings in which.

Figure 1:
FIG. 1 is a plan view of a particular form of silicon device.

FIG. 1 illustrates a silicon device 10, which, as an example, is a linear array of charge coupled devices (CCD's) for use as an imaging device. In the particular device the array of CCD's is seen at 11, with contact pads in groups at each end, at 12 and 13. The aspect ratio of the device 10, that is length to width ratio, is about 20:1. Larger aspect ratios can be accommodated.

The device 10 has to be mounted such that it is protected and capable of being handled and connected to the remainder of a circuit. However the device is extremely fragile, with the geometry, that is the aspect ratio, creating considerable problems.

Normally such devices are mounted on substrates of ceramic or glass, or similar materials. These materials have a flatness limit which, while acceptable for relatively small devices, (chips or dies), of more conventional geometry, square or rectangular, creates considerable problems for non-conventional forms.

Two conventional ways of mounting device 10 are: (a) custom package and (b) shelf package.

A custom package would comprise a ceramic substrate having a metallized cavity suited to the bonding schedule dictated by the chip, die or device, to be mounted therein. Such a package has several problems and disadvantages:

(i) the flatness mismatch between ceramic and silicon device, typically 0.005" for ceramic versus 0.0002" silicon wafers;

(ii) thermal mismatch—typically $7 \times 10^{-6}$ inches/°C. for ceramic versus 2 to $7 \times 10^{-6}$ inches/°C. for silicon wafers;

(iii) tooling costs—very expensive.

A shelf package would use a ceramic base, bought off-shelf, with the device mounted on a ceramic substrate mounted on the ceramic base. Thick film formation of the associated circuitry on the ceramic substrate would be possible but the flatness mismatch and thermal mismatch, as described above, still remain. Also the desired conductor pattern geometry would push thick film technology to its limit. Thin film on ceramic would avoid the problem of the limitation of thick film technology for the conductor pattern but the flatness and thermal mismatch problems would still remain.

There is thus a considerable problem regarding the mounting of the long thin array device 10 on a base or substrate and in providing electrical connection to the array.

The present invention provides for mounting, and connecting, of a device having such geometrical problems by the provision of an intermediate substrate of a silicon wafer having a geometric form which substantially overcomes, or avoids the problems of flatness and thermal mismatch.

Thus, in accordance with one feature of the invention there is provided a substrate of silicon, the substrate having a relatively low aspect ratio, that is the ratio of length to width. A mounting position is delineated on the silicon substrate and the connection circuitry formed on the silicon substrate by conventional means, for example photolithographic etching. The contact pads on the device 10 are wire bonded to contact positions on the circuitry and the circuitry is in turn connected to terminal members on the ceramic base, after the silicon substrate is bonded to the ceramic base. The more conventional geometry of the silicon substrate is not subject to the problems of features and thermal mismatch, as occurs with the considerably more fragile device.

In accordance with another feature of the invention there is provided a packaged device comprising a ceramic base having a recess on its upper surface; a silicon substrate mounted in said recess; an electrical connection circuit or pattern on the upper surface of the silicon substrate; a silicon device mounted on the upper surface of the silicon substrate and conductive leads connecting contact pads on the device to contact areas on the silicon substrate; terminals on the ceramic base and means connecting the terminals to contact areas on the silicon substrate; and a cover bonded to the ceramic base to hermetically seal the device and substrate within the recess.

Figure 2:
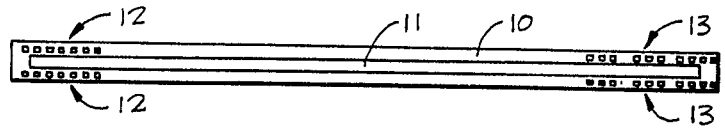
FIG. 2 is a plan view of the device in FIG. 1 to a larger scale.

FIG. 2 illustrates the device 10, of FIG. 1, to a larger scale, with the individual contact pads at 12 and 13. In the particular example eighteen contact pads at 12 are used and eight contact pads are used at 13. The number and arrangement of contact pads can vary.

Figure 3:
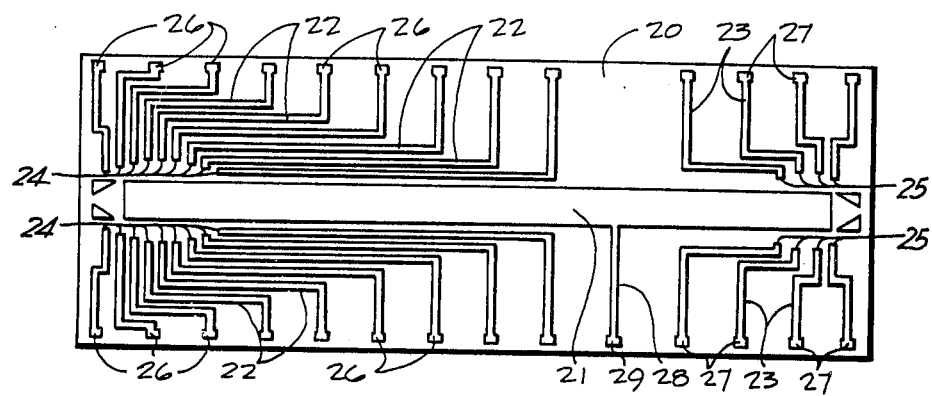
FIG. 3 is a plan view of a silicon substrate for the mounting of the device of FIGS. 1 and 2.

FIG. 3 illustrates a silicon substrate 20 on the upper surface of which is provided an electrical conductor pattern. The pattern comprises a central, elongate member or conductor 21, to which the device 10 is bonded. A plurality of conductors 22 and 23 are also formed, conductors 22 terminating adjacent to one end of the elongate conductor 21, at contact areas 24. Conductors 23 terminate adjacent to the other end of the elongate conductor 21 at contact areas 25. The ends of conductors 22 and 23 remote from contact areas 24 and 25 terminate at contact pads 26 and 27 respectively, spaced along the opposite edges of the substrate. A further conductor 28 extends from the elongate conductor 21 to a contact pad 29 at one edge of the substrate.

Figure 4:
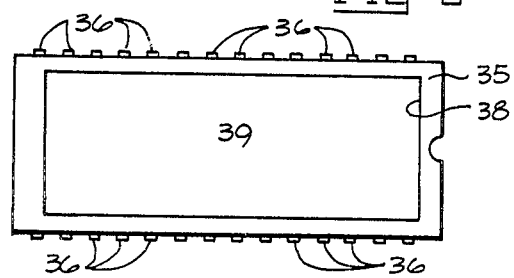
FIGS. 4, 5 and 6 are top plan view, side view and end view respectively of a ceramic base for the mounting, or packaging, of the device and substrate of FIGS. 1, 2 and 3, a glass cover plate being shown spaced from and above the base.
Figure 5:
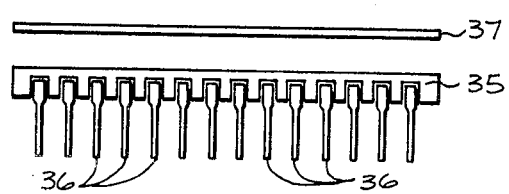
Figure 6:
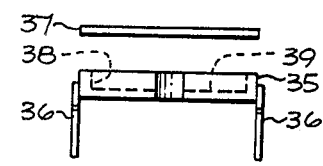
Figure 7:
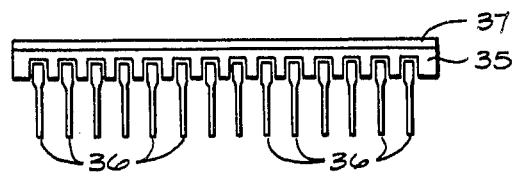
FIG. 7 is a side view, similar to that of FIG. 5, with the glass cover in position.

FIGS. 4, 5 and 6 illustrate a ceramic base 35 with terminals 36. A glass cover 37 is provided. The base 35 is recessed at 38 and has a flat surface 39. The glass cover 37 is bonded to the ceramic base 35 after mounting of substrate and device in the recess. FIG. 7 illustrates the cover 37 bonded to the base, for example by an epoxy resin adhesive. In the particular example, in which the device is an imaging device, the cover 37 must be transparent to the light being directed on to the CCD array but for other forms of device where this is not a requirement then a ceramic or other, for example metallic cover can be used.

Figure 8:
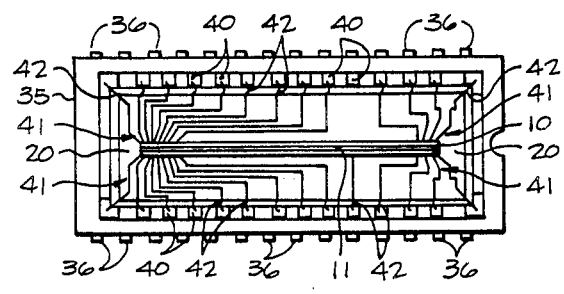
FIG. 8 is a top plan view, similar to that of FIG. 4, with the device and substrate mounted on the base.

FIG. 8 illustrates an assembled package, as in FIG. 7. The terminals extend through the base, being hermetically sealed, and connect with metallized contact pads 40 on the surface 39. The silicon substrate 20 is bonded to the surface 39, as by an epoxy resin adhesive, with the device 10 bonded to the substrate 20. Wire bonds, indicated generally at 41 interconnect the contact areas 24 and 25 of the conductors 22 and 23 and the contact pads in the areas 12 and 13 on the device. Similarly wire bonds connect the contact pads 26 and 27 of the conductors 22 and 23 with the metallized contact pads 40, as indicated at 42.

Figure 9:
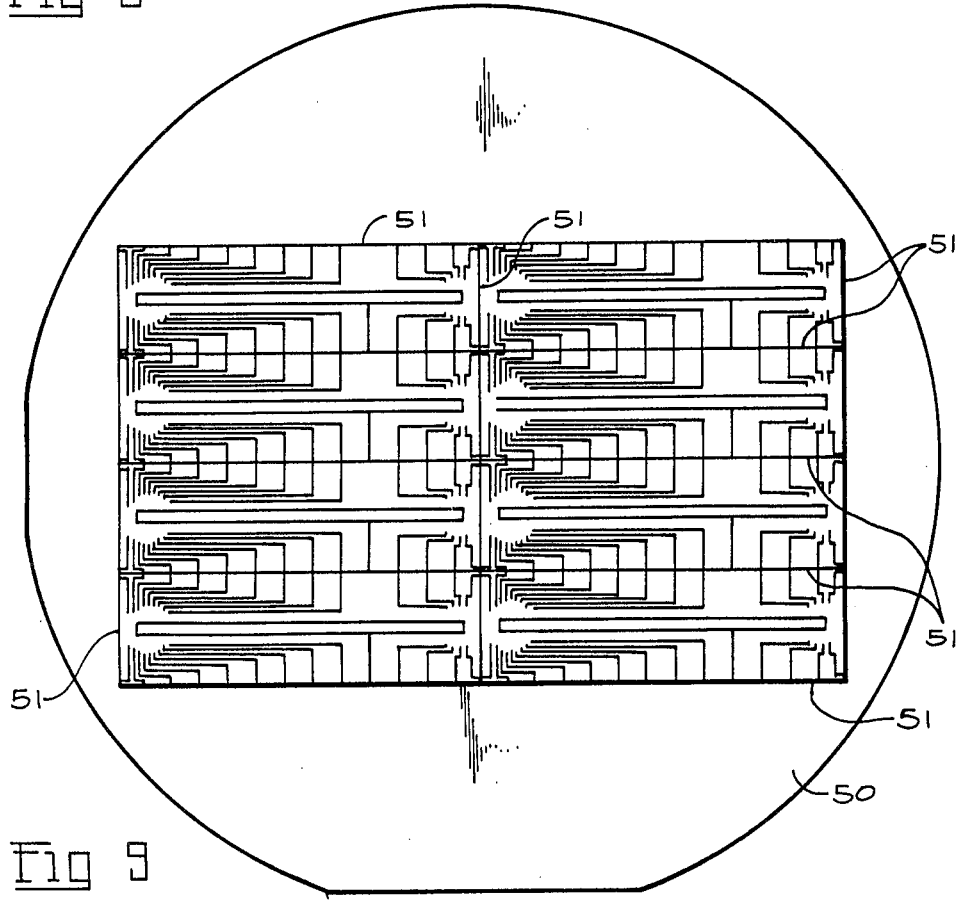
FIG. 9 is a plan view of a silicon wafer, with eight substrates prepared thereon prior to sawing or scribed and cleaving.

FIG. 9 illustrates one particular arrangement for forming silicon substrate 20. A silicon wafer 50 has a plurality of conductor patterns formed thereon. The particular process itself is conventional and comprises the following steps: oxidize the surface of the wafer, as by thermal oxidation, to form an insulating layer; then deposit layer of electrically conductive material, for example aluminum; photolithographically etch to form conductor patterns, that is elongated conductor 21, and conductors 23 and 24. The wafer can then be covered, if desired, with a protective layer, with the contact areas and pads left uncovered.

The wafer is then cleaved, along the lines 51, to produce a number of substrates, in the present example eight. A substrate is then mounted in a ceramic base, the device bonded to the conductor 20, and then wire bonding to connect the device to the substrate and the substrate to the terminals of the base. The cover is then bonded to the base.

The technology for producing the conductor patterns on the wafer is well known, and is readily carried out quickly and economically. The substrate 20 is of such a geometry that it can readily be mounted on a ceramic substrate without problems. This compares with using a custom package in which a special ceramic base is made with the necessity of producing the conductor patterns on the ceramic. The technology for production of the conductor patterns is not so easy or economic and the flatness of the ceramic is such that the device could easily break on laying down. Even if the device did not break on laying down, stresses could well be created that terminal stresses added to them could result in breakage. This would be a very expensive form of assembly.

Using an "off-the-shelf" ceramic base and then providing a conventional ceramic substrate enables cheaper basis to be used, avoiding special tooling, but there is still the problem of mounting the device on ceramic.

The feature of using a silicon substrate, mounting a silicon device on a silicon substrate avoids stress problems in the device. Due to the larger size of the silicon substrate relative to the device, stress problems due to flatness and other causes are far less critical and well within the capability of the silicon substrate. Well known techniques can be used for making the substrate and readily available "off-the-shelf" ceramic bases can be used, to provide an effective and economic package. If numbers make it worthwhile, a custom base can be made, but generally the silicon substrate can readily be adapted to suit a readily available base.

The device as illustrated in FIG. 1 is approximately twice full scale, the particular example being approximately 1" long by approximately 0.040". Similarly the items illustrated in FIGS. 4 to 8 are also approximately twice full scale, with the device in FIG. 2 and substrate in FIG. 3 being to a larger scale, for clarity. The actual geometry of the device can vary. Thus even shorter devices, for example having a length to width ratio of ten or more, or even smaller ratios. The devices may not necessarily be elongate but may be of some other configuration.

The silicon substrate is thin, generally formed from a silicon wafer, the substrate thus being of wafer-like thickness.

What is claimed is:

1. A method of mounting an elongate silicon device on a ceramic base, comprising:
    forming a silicon substrate;
    defining an elongate mounting position on a surface of said silicon substrate;
    forming a conductor pattern on said surface of said silicon substrate, said pattern comprising a plurality of conductors, each conductor including a contact area at one end adjacent to said mounting position and a contact pad adjacent to an edge of the silicon substrate;
    mounting said silicon substrate on said ceramic base, said base including a plurality of terminals and a plurality of contact pads, a pad associated with each terminal;

mounting said elongate silicon device on said silicon substrate at said mounting position, said device including a plurality of contact pads;

electrically connecting a contact area on each conductor to a related contact pad on said silicon device and a contact pad on each conductor to a related contact pad on said ceramic base; and applying a cover to said base to enclose said silicon device and said silicon substrate.

2. A method as claimed in claim 1, including mounting said silicon substrate in a recess in said ceramic base.

3. A method of mounting and packaging an elongate silicon device on a ceramic base, comprising:

providing a ceramic base having a recess in a top surface, said base including a plurality of terminals extending from the periphery of the base and a plurality of contact pads in said recess adjacent the periphery thereof, a pad associated with and connected to each terminal;

forming a silicon substrate for positioning in said recess, including defining an elongate mounting position on a top surface of the substrate and forming a conductor pattern on said top surface, each conductor formed with a contact area at one end adjacent to said mounting position and a contact pad at the other end adjacent to an edge of the substrate;

mounting said silicon substrate in said recess;

mounting said silicon device on said silicon substrate at said mounting position;

forming wire bond connections between each of said contact areas of said conductors and related contact pads on said silicon device and between each of said contact pads of said conductors and said ceramic base;

bonding a cover to said base over said recess to seal said silicon device and silicon substrate in said base.

* * * * *